United States Patent [19]

Jett, Jr.

[11] 4,375,618
[45] Mar. 1, 1983

[54] LINEARIZED FM QUADRATURE DETECTOR

[75] Inventor: William B. Jett, Jr., San Jose, Calif.

[73] Assignee: National Semiconductor Corporation, Santa Clara, Calif.

[21] Appl. No.: 230,197

[22] Filed: Feb. 2, 1981

[51] Int. Cl.³ .......................... H03D 3/14; H03D 3/26
[52] U.S. Cl. ..................................... 329/103; 329/136; 329/137; 329/145; 455/214
[58] Field of Search ................ 329/103, 110, 136–138, 329/145, 168, 169; 455/214, 337

[56] References Cited

U.S. PATENT DOCUMENTS 4,236,117 11/1980 Watanabe et al. ................... 329/103
4,342,000 7/1982 Ogita ..................................... 329/103

Primary Examiner—Siegfried H. Grimm
Attorney, Agent, or Firm—Gail W. Woodward; Paul J. Winters; Neil B. Schulte

[57] ABSTRACT

In an FM receiver a multiplier is driven from the IF limiter. The limiter also drives a single tuned circuit which produces a quadrature signal that drives a second port in the multiplier. When the quadrature signal is multiplied by the IF signal an FM detector results. The center frequency is determined by the frequency of the quadrature relationship and the extent of the resultant output curve is determined by the Q of the tuned circuit. The output response is linearized by varying the current in the multiplier as a function of the IF signal deviation.

10 Claims, 7 Drawing Figures

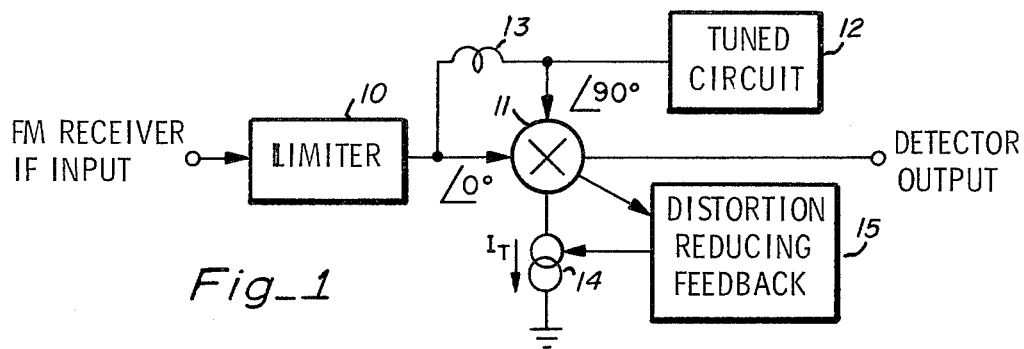
Fig_1
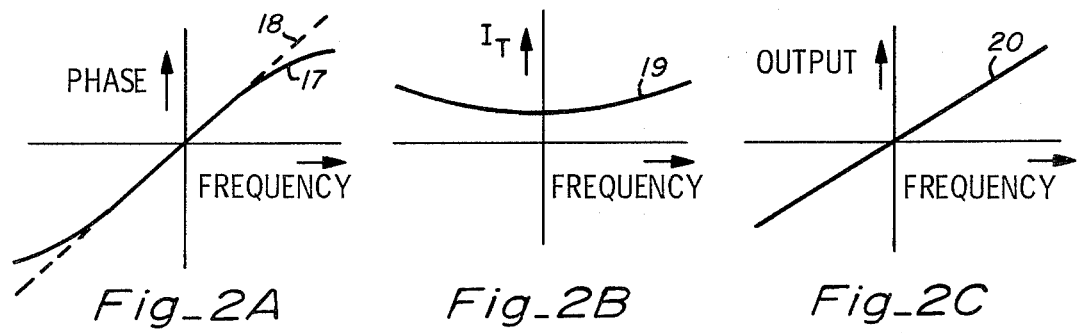
Fig_2A  Fig_2B  Fig_2C
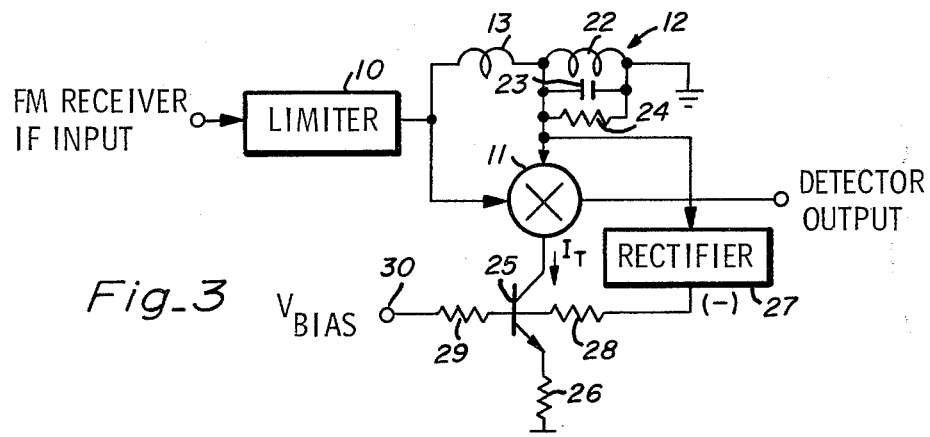
Fig_3
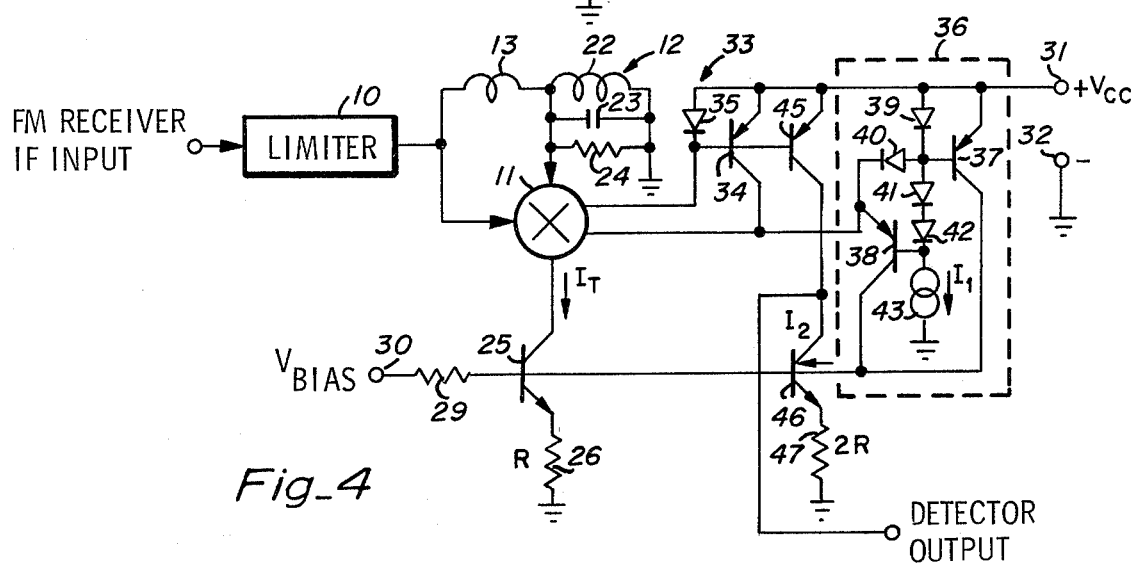
Fig_4

LINEARIZED FM QUADRATURE DETECTOR

BACKGROUND OF THE INVENTION

The invention is related to Frequency Modulation (FM) detection using the so called quadrature detector approach. Specifically a monolithic silicon integrated circuit (IC) structure is employed to create an FM detector that is highly linearized.

Quadrature FM detection is well known in the IC art. A paper titled "applications of a Monolithic analog Multiplier" was published in the December, 1968 issue of the IEEE Journal of Solid-State Circuits (SC-3 No. 4) on pages 373-380. A commercial device using this sort of detection is identified as the LM1351 which has been available since about 1972. In this kind of FM detector a multiplier is driven from an IF limiter which also drives a single tuned circuit which in turn produces a quadrature signal that also drives the multiplier. The tuned circuit is adjusted so that the S-shaped detector transfer characteristic is centered at the IF.

Such detectors have proven to be very useful. Only a single tuning adjustment is required and the circuit is readily reduced to IC form which can incorporate other receiver elements as well. The associated FM receiver is quite straight forward and performs well. However, since only a single tuned circuit is used in the detector, the resultant transfer characteristic, while closely approximating a straight line near the center frequency tends to depart from a straight line when the FM signal deviates appreciably. Because of the wide deviation of a conventional FM signal the departure from a straight line introduces harmonic distortion, particularly for the louder signals. The distortion can be reduced by lowering the Q of the tuned circuit but this reduces the output signal level so that reduced signal-to-noise ratio occurs. It would be desirable to employ a tuned circuit Q that is high enough to maintain a high signal-to-noise ratio at the detector output and to avoid the harmonic distortion at wide deviation by other means. This would be of considerable value in the so called "High Fidelity" or Hi Fi reproduction of FM signals.

SUMMARY OF THE INVENTION

It is an object of the invention to provide a monolithic IC FM detector using a single tuned circuit in a multiplier circuit wherein the multiplier current is modulated to linearize the signal transfer characteristic.

it is a further object of the invention to linearize the operation of a multiplier by modulating its current in response to its output signal or in response to its rectified tuned circuit signal.

These and other objects are achieved as follows. A conventional analog multiplier circuit is created in monolithic IC form. The multiplier tail current, which is ordinarily fixed by the action of a current mirror, is modulated to linearize the transfer function. In one approach, the modulating current is realized by rectifying the signal present in the associated tuned circuit. As the IF input signal deviates from its center frequency the reduced signal available across the tuned circuit raises the multiplier current thereby correcting for the normally experienced departure from linearity. In another approach the multiplier output is coupled to a full wave rectifier, the output of which is coupled to the multiplier tail current transistor. Thus, the tail current is increased as the multiplier output is deviated from its quiescent state. This latter approach is preferred. In the Hi Fi version of the preferred embodiment the multiplier is operated symmetrically using its balanced output. The output is converted to single ended form in a separate differential operational amplifier. The result is a detector having very low distortion and noise performance while retaining the advantages of the prior art circuit.

BRIEF DESCRIPTION OF THE DRAWING

FIG. 1 is a block diagram illustrating the invention.

FIG. 2A is a graph of phase versus frequency response of the circuit of FIG. 1.

FIG. 2B is a graph of total current versus frequency for the circuit of FIG. 1.

FIG. 2C is a graph of frequency versus output for the circuit of FIG. 1.

FIG. 3 is a partial schematic block diagram of one embodiment of the invention.

FIG. 4 is a schematic diagram of an alternative embodiment of the invention.

DESCRIPTION OF THE INVENTION

Figure 5:
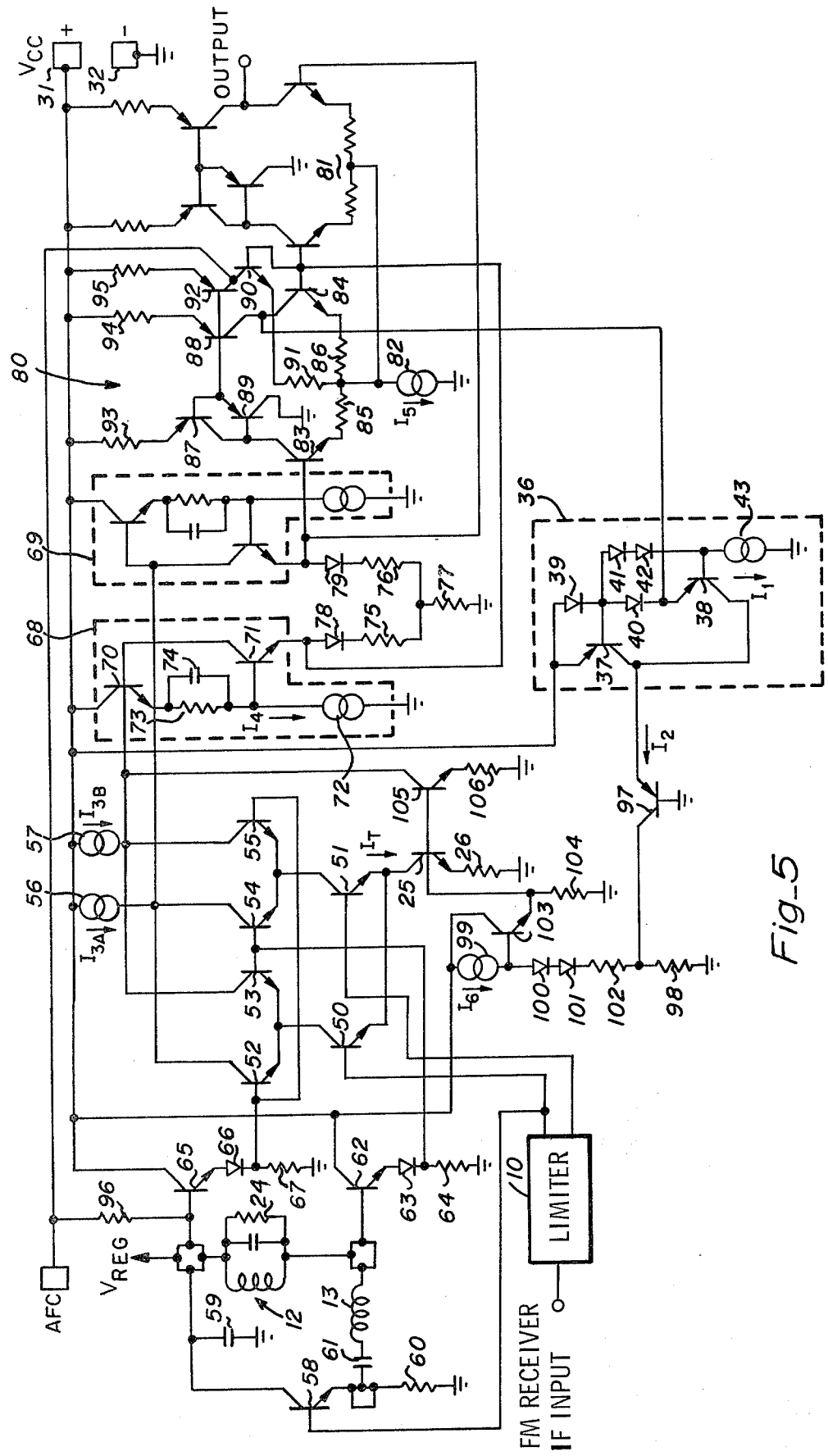
FIG. 5 is a schematic diagram if the preferred embodiment of the invention.

With reference to FIG. 1 a block diagram of an FM detector is shown. The detector is to be used with an FM receiver (not shown). Limiter 10, which is the last IF stage in the FM receiver, drives one input of a multiplier 11. The limiter also applies a signal to tuned circuit 12 via inductor 13 which acts to drive the tuned circuit in quadrature (90°) with respect to the limiter output at the center frequency. The tuned circuit applies the second input to the multiplier which acts to produce an output that represents the frequency modulation of the IF signal. The multiplier total current ($I_T$) is caused to flow in current source 14 which is controlled as shown in block 15 by a signal fed back from multiplier 11.

FIGS. 2A through 2C illustrate the detector action. As shown in FIG. 2A the circuit of FIG. 1 has a phase response 17 that is related to signal frequency. Dashed line 18 shows an ideal response and the departure of line 17 is exaggerated to show the basic detector nature. As can be seen the detector phase response departs from ideal as the frequency is deviated from the center frequency which is located at the origin of the curves. In FIG. 2B the multiplier current is plotted on line 19 as a function of frequency. The current at the center frequency is the nominal value of $I_T$ in source 14. As the frequency deviates, the current is increased by the feedback circuit 15. The current increase is determined by the departure of curve 17 from ideal. The net result of curve 19 is shown as curve 20 in FIG. 2C. It can be seen that curve 20 closely approximates the ideal current curve 18.

FIG. 3 is one embodiment of the invention. Tuned circuit 12 comprises inductor 22 and capacitor 23. Shunt resistor 24 controls the tuned circuit Q. Current source 14 is shown as transistor 25 with its emitter resistor 26. A rectifier 27 is coupled to tuned circuit 12 so as to rectify its signal and to provide a negative rectified potential to resistor 28. Resistor 29 is returned to a constant voltage bias, $V_{BIAS}$, at terminal 30. The values of resistors 28 and 29 are selected so that the correct fraction of the output of rectifier 27 appears at the base of transistor 25. At the circuit center frequency, the potential from rectifier 27 is maximum. As the frequency deviates, the rectified potential decreases and the current flowing in transistor 25, increases. The component values are selected so that the detector output is linearized as shown in FIG. 2A, 2B and 2C.

FIG. 4 shows an alternative embodiment of the invention. The part common to those of FIG. 2 bear the same reference numerals. However, the double-end or push-pull output form is shown. The form of multiplier operation is preferred for Hi Fi circuit operation.

In the following discussions it will be assumed that transistors having high Beta, or current gain, are present. This means that in terms of collector currents, the base current can be neglected. Where this approximation does not hold, it will be specifically identified.

The circuit operates from a power supply, $V_{CC}$, which is connected between positive terminal 31 and ground 32. Current mirror 33 converts the double ended output of multiplier 11 to a single ended drive to full wave rectifier 36 which is referenced to $+V_{CC}$.

Rectifier 36, which includes two PNP transistors 37 and 38 biased by four diodes 39–42 using a current source 43 is shown inside a dashed outline. Assuming that the diodes have the same area relationships as the PNP transistors it can be seen that current source 43, which draws $I_1$, will turn diodes 39, 41, and 42 on so that $I_1$ flows in transistor 37. Diodes 40–42 bias transistor 38 so that it too draws $I_1$. The total zero signal current flowing at $I_2$ is nominally 2 $I_1$ and is returned to $V_{Bias}$ terminal 30 via resistor 29. This quiescent current is made small enough so that it has a negligible effect upon $I_T$. However, if the collector of transistor 34 swings more positive, due to its increasing conductivity, it can be seen that transistor 38 will increase its conductivity and $I_2$ will increase accordingly. If the collector of transistor 34 swings downward, due to its decreasing current, more current will be passed in diodes 39 and 40. This increase in current is mirrored in transistor 37 so that $I_2$ represents a similar increase. Thus regardless of which way the collector of transistor 34 swings the output current of rectifier 36 increases thereby providing a full wave rectification action.

This means that for any audio signal out of multiplier 11, the value of $I_2$ will include a full wave rectified version thereof. This current is applied to transistor 25 so that $I_T$ will be increased as the signal to multiplier 11 deviates from its center frequency.

It can be seen that the output of multiplier 11 contains the audio signal recovered from the FM along with a full wave rectified component. The remainder of the circuit includes components for reproducing only the audio signal. Diode 35 also drives transistor 45 in current mirror configuration. Transistor 46, which also passes the current in transistor 45 acts as a load element. The audio output is obtained at the collector of transistor 46. If the value of resistor 47, in the emitter of transistor 46, is made twice the value of resistor 26 the full wave rectified signal component out of multiplier 11 will be canceled. Thus the mere ratioing of two resistors permits the canceling of the audio distortion that the linearizing circuitry would otherwise produce.

FIG. 5 represents an IC version of the invention and is the preferred embodiment. Where the elements relate to the other figures, the same numbers are used. The square blocks denote IC pads for external component connections. Multiplier 11 comprises transistor 50-55 arrayed in conventional fashion. A double ended ouput is available across current source loads 56 and 57 which pass currents $I_{3A}$ and $I_{3B}$ respectively. Limiter 10 directly drives transistors 50 and 51 as is customary. The limiter also drives emitter follower transistor 58 which includes load resistor 60. The signal that appears across resistor 60 is coupled, via DC blocking capacitor 61, to inductor 13. Inductor 13 quadrature drives tuned circuit 12 which is returned to a source of regulated voltage $V_{REG}$. The regulated voltage, typically about 5.6 volts, is produced from an on chip circuit (not shown) and is bypassed by capacitor 59.

The quadrature voltage appearing across tuned circuit 12 is coupled via emitter follower transistors 62 and 65 to multiplier 11. Transistor 62 which includes diode 63 and load resistor 64 drives transistors 53 and 54. Transistor 65 which includes diode 66 and load resistor 67 drives transistors 52 and 55. Since both bases of transistors 62 and 65 are at the DC level of $V_{REG}$ it can be seen that transistors 52-55 all have their bases at a DC levl of about 4.2 volts.

Current sources 56 and 57 operate the collectors of multiplier transistors 52-55 at a DC level that is above the 4.2 V base voltage and they are therefore closer to $V_{CC}$. Since the multiplier output is balanced it will be treated in diff-amp fashion as will be described hereinater. This means that the linearization circuit will produce common mode distortion signals which will therefore be ignored. Thus the distortion correction described previously will not be required. Since the multiplier output is close to $V_{CC}$ and is to be coupled to diff-amps 80 and 81, which operate closer to ground, a pair of voltage shifters 68 and 69 are employed. Since both of these circuits operate identically only one (68) will be described in detail.

A pair of NPN transistors 70 and 71 are employed along with current source 72 to drive diff-amps 80 and 81. The current flowing in resistor 73 is substantially $I_4$ flowing in source 72. The voltage across resistor 73 represents a shift between the levels of a pair of cascaded emitter followers which operate at close to unity gain. Capacitor 74 broadband compensates the frequency response of the cascaded emitter followers. Thus the voltage at the emitter of transistor 71 follows the voltage at the collectors of transistors 53 and 55 but at a substantially shifted DC level. The shift is the voltage drop across resistor 73 plus two $V_{BE}$.

Resistors 75–77 along with diodes 78 and 79 form a network that acts to linearize diff-amps 80 and 81. It is configured to simulate a diff-amp input and is connected in parallel with the inputs of diff-amps 80 and 81. Resistor 77 simulates the common mode represented by current source 82 which is common to diff-amps 80 and 81 and passes $I_5$. Resistor 75 simulates resistor 86 and resistor 76 simulates resistor 85.

Diff-amp 80 has two outputs. One drives full-wave rectifier 36 and the other provides an AFC output. The output which drives the full-wave rectifier is obtained from transistors 87–89 which form a current mirror load for input transistors 83 and 84. The AFC output is obtained via current mirror load action of transistors 87, 89 and 92 operating as a load for input transistors 83 and 90. Resistors 85, 86, an 91 degenerate the input transistors and resistors 93–95 control the load currents.

The collector of transistor 90 comprises the AFC output and resistor 96 returns the AFC output to $V_{REG}$ to provide a reference therefore. Such AFC may be useful in an FM radio receiver and will not be further detailed herein.

Diff-amp 81 is driven in parallel with diff-amp 80 and its single ended output constitutes the detector output terminal. Its operation is similar to that of one section of diff-amp 80.

As previously described, transistor 84 provides the output of diff-amp 80 which is applied to full-wave rectifier 36. In this circuit 36, the output of multiplier 11 is full-wave rectified. The output $I_2$ of full-wave rectifier 36 is coupled to the emitter of PNP transistor 97. The rectified signal current flows in resistor 98. The effect of transistor 97 is to roll off the current feedback at a frequency below the FM IF of 10.7 MH$_Z$. Since the typical PNP IC transistor has a 6 db per octave frequency roll off above about 3 MH$_Z$, any IF signal present will be substantially attenuated.

Current source 99 produces $I_6$ which flows through diodes 100 and 101 and through resistors 102 and 98. Source 99 produces a value of $I_6$ that is well over ten times that of current sources 43 in full wave rectifier 36. This means that $I_6$ dominates the current in resistor 98. However, the full-wave rectified version of the detector output will appear across resistor 98 as a linearizing or corrective signal.

The lower end of source 99 is coupled to emitter follower transistor 103 which employs resistor 104 as a load. This is the point at which the linearizing signal is applied to transistor 25 which sets the $I_T$ of multiplier 11.

The same linearizing signal is fed to the base of transistor 105 which has emitter degeneration resistor 106. The collector of transistor 105 is connected to load 57 to divert a portion of the current therefrom. The action of transistor 105 is to deliberately introduce a shift in the detector crossover frequency in such a way as to compensate for urbalance due to the inherent phase shift in the transistors that pass the quadrature signal.

EXAMPLE

The circuit of FIG. 5 was fabricated using conventional monolithic IC techniques. The NPN transistors were of vertical construction and the PNP transistors of lateral construction. The diodes were NPN transistors with their collectors shorted to their bases. The other components employed had the following values:

| PART NUMBER | VALUE | UNITS |
| --- | --- | --- |
| *Tuned Circuit | 12 | 10.7 MHz |
| *Inductor | 13 | 22 Microhenries |
| *Resistor | 24 | 3.9K Ohms |
| Resistor | 26 | 620 Ohms |
| Current Source | 43 | 15 Microamperes |
| Current Sources | 56,57 | 1.7 Milliamperes |
| *Capacitor | 59 | 100 Microfarads |
| Resistor | 60 | 4K Ohms |
| *Capacitor | 61 | .01 Microfarads |
| Resistors | 64,67 | 8.2K Ohms |
| Current Source | 72 | 450 Microamperes |
| Resistor | 73 | 5.6K Ohms |
| Capacitor | 74 | 3 Picofarads |
| Resistors | 75,76 | 360 Ohms |
| Resistor | 77 | 390 Ohms |
| Current Source | 82 | 2.4 Milliamperes |
| Resistors | 85,86 | 360 Ohms |
| Resistor | 91 | 720 Ohms |
| Resistors | 93,95 | 220 Ohms |
| Resistor | 94 | 440 Ohms |
| Resistor | 96 | 3.6K Ohms |

*Components external to the IC.

The circuit was operated from a 9-volt supply and was fed a modulated FM radio IF signal strong enough to ensure limiting. With a deviation of ±75 KHz the total harmonic distortion was under 0.1% which is at least five to one better than an uncompensated detector. The signal to noise ratio was better than 80 db.

The invention has been described and an operating example detailed. Clearly, when a person skilled in the art reads the foregoing, it will be apparent that there are alternatives and equivalents that are within the spirit and intent of the invention. Accordingly it is intended that the scope of the invention be limited only by the following claims.

I claim:

1. In an FM detector comprising a multiplier having input signal means, output signal means, current control means and means for coupling said multiplier to a source of signal in phase quadrature with with the signal coupled to said input signal means, the improvement comprising:
    means for varying the current in said current control means so tha the current in said multiplier increases as the input signal coupled to said input signal means deviates from its center frequency whereby the linearity of said detector is increased.

2. The improvement of claim 1 wherein said means for varying comprise a controlled current source, and said source of signal in phase quadurature is obtained from a single resonant circuit.

3. The improvement of claim 2 wherein said means for varying further comprise an amplitude detector having an input coupled to said resonant circuit and an output coupled to said controlled current source.

4. The improvement of claim 2 wherein said controlled current source is coupled to the output of a full wave rectifier, the input of which is coupled to said output signal means of said multiplier.

5. The improvement of claim 4 further including a current mirror interposed between said full wave rectifier and said output signal means.

6. The improvement of claim 5 wherein said current mirror is in the output section of a differential operational amplifier having a pair of differential inputs coupled to said output signal means of said multiplier.

7. The improvement of claim 6 further including unity voltage gain level shifting means interposed between said differential operational amplifier and said multiplier.

8. An FM detector comprising:
    a multiplier having first and second input ports, and output port and a source of operating current;
    means for driving said first port with a constant amplitude signal;
    a tuned circuit;
    means for driving said tuned circuit from said means for driving said first port in quadrature therewith;
    means for coupling said tuned circuit to said second port for supplying a quadrature signal thereto; and
    means for modulating said source of operating current in response to the deviation of said constant amplitude signal from the center frequency of said tuned circuit.

9. The detector of claim 8 wherein said means for modulating comprise a rectifier having an input coupled to said tuned circuit and an output coupled to said source of operating current.

10. The detector of claim 8 wherein said means for modulating comprise a full wave rectifier having an input coupled to said multiplier output port and an output coupled to said source of operating current.

* * * * *